(12) United States Patent
Fabregas et al.

(10) Patent No.: US 8,736,468 B2
(45) Date of Patent: May 27, 2014

(54) METHOD AND SYSTEM FOR MONITORING FOR VARIATION OF CONVERTER VOLTAGE REFERENCE

(71) Applicant: Lear Corporation, Southfield, MI (US)

(72) Inventors: Antoni Ferre Fabregas, Valls (ES); David Gamez Alari, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 13/679,370

(22) Filed: Nov. 16, 2012

(65) Prior Publication Data

US 2013/0154866 A1 Jun. 20, 2013

Related U.S. Application Data

(60) Provisional application No. 61/576,684, filed on Dec. 16, 2011, provisional application No. 61/576,454, filed on Dec. 16, 2011.

(51) Int. Cl.
*H03M 1/06* (2006.01)
*H03M 1/08* (2006.01)

(52) U.S. Cl.
CPC .......... *H03M 1/0845* (2013.01); *H03M 1/0604* (2013.01); *H03M 1/089* (2013.01)
USPC .......................................... 341/118; 341/155

(58) Field of Classification Search
USPC ................................................ 341/118–120
See application file for complete search history.

(56) References Cited

U.S. PATENT DOCUMENTS

| | | | |
|---|---|---|---|
| 5,757,210 A | 5/1998 | Sanzo | |
| 6,249,161 B1 | 6/2001 | Pontarollo | |
| 6,567,022 B1 * | 5/2003 | Reuveni et al. | ............... 341/120 |
| 8,421,657 B2 * | 4/2013 | Ikeda et al. | ................... 341/118 |
| 2002/0047695 A1 | 4/2002 | Cocetta | |
| 2008/0309163 A1 | 12/2008 | Hashimoto et al. | |
| 2011/0057704 A1 | 3/2011 | Ptacek et al. | |
| 2011/0062877 A1 | 3/2011 | Yang et al. | |

OTHER PUBLICATIONS

Stuart Ball, Analog-to-Digital Converters, May 1, 2001, EE Times, www.eetimes.com/document.asp?doc_id=1276974.*

* cited by examiner

*Primary Examiner* — Howard Williams
(74) *Attorney, Agent, or Firm* — Brooks Kushman P.C.

(57) ABSTRACT

A method and system include a converter such as an analog-to-digital converter ("ADC") and a controller. The converter is configured to receive a sensor signal, indicative of a physical measured quantity, and generate an output signal based on the sensor signal and the voltage reference. The converter is further configured to alternately receive a calibration voltage in lieu of the sensor signal and generate the output signal based on the calibration voltage and the voltage reference. The controller is configured to compare the output signal based on the calibration voltage and the voltage reference with an expected value of the output signal based on the calibration voltage and an assumed value of the voltage reference to detect variation of the voltage reference, and to compensate the output signal based on the sensor signal and the voltage reference as a function of the detected variation of the voltage reference.

16 Claims, 2 Drawing Sheets

METHOD AND SYSTEM FOR MONITORING FOR VARIATION OF CONVERTER VOLTAGE REFERENCE

CROSS-REFERENCE TO RELATED APPLICATIONS

This application claims the benefit of U.S. Provisional Application No. 61/576,684, filed Dec. 16, 2011, and U.S. Provisional Application No. 61/576,454, filed Dec. 16, 2011; the disclosures of which are incorporated in their entirety by reference herein.

TECHNICAL FIELD

The present invention relates to converters, such as analog-to-digital converters ("ADC"), employing a voltage reference for converting an analog signal into a digital signal and vice versa.

BACKGROUND

Modern vehicles include systems having complex electric circuits for performing different functions. Common circuits include an analog-to-digital converter ("ADC") in communication with a sensor. The sensor measures a physical quantity and generates an analog electrical signal indicative of the measured physical quantity. The ADC receives the analog signal from the sensor and converts it into a digital electrical signal (i.e., a digital value, a digital output code, etc.).

The analog sensor signal is typically a voltage signal (i.e., sensor input $V_{IN}$). The ADC generates the digital output code for the sensor input $V_{IN}$ by comparing the sensor input $V_{IN}$ with a voltage reference $V_{REF}$. The voltage reference $V_{REF}$ may be externally provided to the ADC or may be internally generated in the ADC itself. The voltage reference $V_{REF}$ is intended to be a precise 'measuring stick' against which the sensor input $V_{IN}$ is compared. Under error free operation, the ADC generates the digital output code for the sensor input $V_{IN}$ according to the following equation:

$$\text{output} = V_{IN} * (2^n / V_{REF})$$

where "output" is the digital output code in decimal form and "n" is the number of bits of resolution of the ADC. The resolution indicates the number of discrete values the ADC can produce over the range of analog values. The values are usually stored in binary form so the resolution is expressed in bits. For example, an ADC with a resolution of eight bits can encode the analog sensor input $V_{IN}$ to one in 256 different levels since $2^8 = 256$.

As shown in the above equation for generating the digital output code, the digital output code varies inversely proportional to the voltage reference $V_{REF}$. Significant to embodiments of the present invention, as described below, is that the digital output code is a function of the voltage reference $V_{REF}$. As such, the voltage reference $V_{REF}$ has to be precise in order for the ADC to output an accurate digital output code for a given sensor input $V_{IN}$.

ADCs drift with aging. These drifts are directly proportional to the variation of the voltage reference $V_{REF}$ used by the ADC in the conversion process. Drifts due to aging are a relatively larger problem than absolute accuracy. The internal error can be calibrated, but compensating for drift is difficult. Where possible, voltage references should be chosen for aging characteristics which preserve adequate accuracy over the expected lifetime of the system employing the ADC.

Some systems such as battery monitoring systems in electric vehicles have requirements that overstress ADCs. These requirements include relatively long lifetimes (for example, a lifetime ten times longer than the lifetime of a conventional vehicle) and relatively high accuracy requirements over time.

SUMMARY

An object of the present invention includes tracking variation of the voltage reference used by an analog-to-digital converter ("ADC") in converting between analog and digital signals and/or compensating for such variation of the voltage reference during the lifetime of the system in which the converter is employed.

In carrying out one or more of the above and other objects, the present invention provides a system having an ADC. The ADC receives a sensor signal, indicative of a physical measured quantity, and generates an output signal based on the sensor signal and the voltage reference. The ADC is further configured to alternately receive a calibration voltage in lieu of the sensor signal and generate the output signal based on the calibration voltage and the voltage reference.

Further, in carrying out one or more of the above and other objects, the present invention provides a system having first and second voltage generators, a sensor, an ADC, and a controller. The first voltage generator generates a voltage reference. The sensor is configured to generate a sensor signal indicative of a physical measured quantity. The ADC generates an output signal based on an input signal and the voltage reference. The second voltage generator is configured to generate a calibration voltage. The controller reads and processes the digital output signal generated by the ADC based on the sensor signal and the voltage reference and alternately reads and processes the digital output signal generated by the ADC based on the sensor signal and the calibration voltage.

Also, in carrying out one or more of the above and other objects, the present invention provides a method. The method includes receiving, at an ADC, a sensor signal indicative of a physical measured quantity and generating, by the ADC, an output signal based on the sensor signal and the voltage reference. The method further includes alternately receiving, at the ADC, a calibration signal in lieu of the sensor signal and generating, by the ADC, the output signal based on the calibration voltage and the voltage reference.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
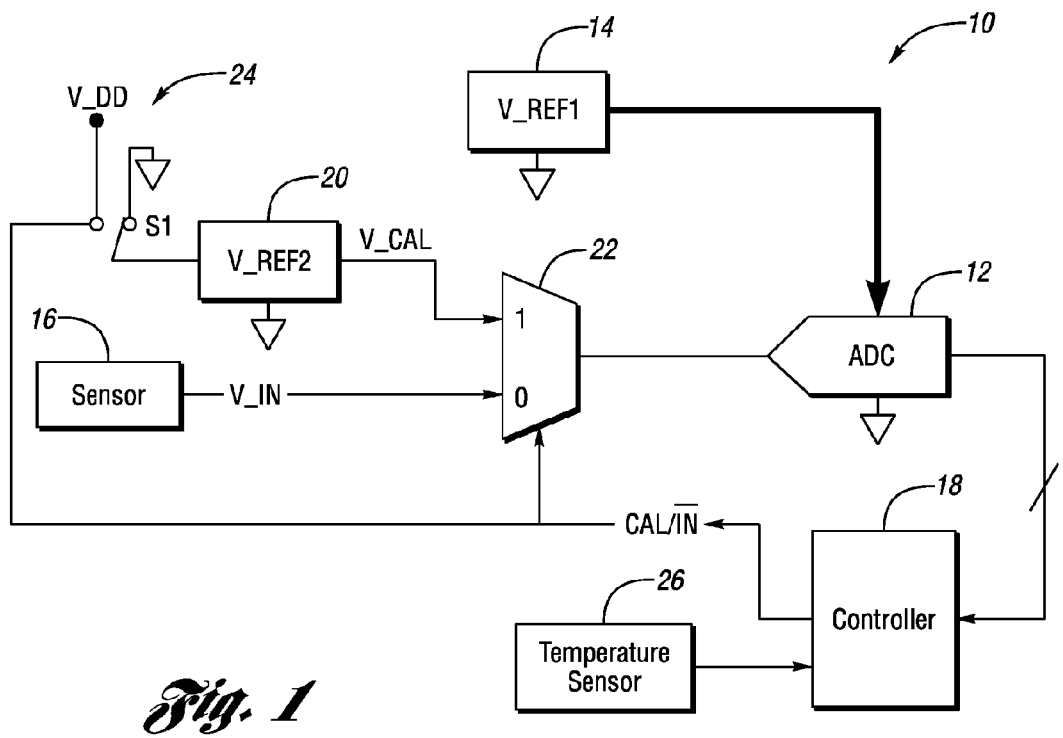
FIG. 1 illustrates a block diagram of a system for monitoring for variation of the voltage reference used by an analog-to-digital converter ("ADC") in converting between analog and digital signals in accordance with an embodiment of the present invention.

Referring now to FIG. 1, a block diagram of a system 10 for monitoring for variation of the voltage reference used by an analog-to-digital converter ("ADC") 12 in converting between analog and digital signals in accordance with an embodiment of the present invention is shown. System 10 is enabled to detect the integrity of ADC 12 by being able to monitor for variation of the voltage reference used by ADC 12 in the conversion process. An external voltage reference generator 14 provides the voltage reference to ADC 12 for the conversion process. This voltage reference is the first voltage reference $V_{REF1}$. As explained above, ADC 12 uses the first voltage reference $V_{REF1}$ in converting input analog signals into output digital signals.

System 10 further includes a second external voltage reference generator 20. Second voltage reference generator 20 is configured to output a calibration voltage $V_{CAL}$. As explained below, second voltage reference generator 20 is controlled to be enabled or disabled at a given time. When enabled, second voltage reference generator 20 generates a second voltage reference $V_{REF2}$ as the calibration voltage $V_{CAL}$. When disabled, 0V is outputted from second voltage reference generator 20.

The system includes a sensor 16. Sensor 16 measures a physical quantity and generates an analog electrical signal indicative of the measured physical quantity. The analog signal generated by sensor 16 is a voltage signal and is designated herein as the sensor input $V_{IN}$.

System 10 further includes an analog multiplexor 22. As shown in FIG. 1, the output of multiplexor 22 is directly connected to the input of ADC 12. Multiplexor 22 is configured to receive two inputs: (i) the sensor input $V_{IN}$ from sensor 16; and (ii) the calibration voltage $V_{CAL}$ from second voltage reference generator 20. As such, ADC 12 is multiplexed with two voltages: (i) the input voltage to be measured (i.e., the sensor input $V_{IN}$ from sensor 16); and (ii) a calibration voltage (i.e., the calibration voltage $V_{CAL}$ from second voltage reference generator 20). Again, the calibration voltage $V_{CAL}$ has the value of the second voltage reference $V_{REF2}$ when second voltage reference generator 20 generates the second voltage reference $V_{REF2}$.

Multiplexor 22 is configured to select one of the sensor input $V_{IN}$ and the output voltage of second voltage reference generator 20 and forward the selected voltage to ADC 12. For instance, at one time, multiplexor 22 selects the sensor input $V_{IN}$ and forwards the sensor input $V_{IN}$ to ADC 12. Conversely, at another time when second voltage reference generator 20 outputs the second voltage reference $V_{REF2}$ as the calibration voltage $V_{CAL}$, multiplexor 22 selects the calibration voltage $V_{CAL}$ and forwards the calibration voltage $V_{CAL}$ to ADC 12.

In normal operation, when the multiplexor is configured to output the sensor voltage $V_{IN}$, the ADC 12 generates the digital output code for the sensor input $V_{IN}$ by comparing the sensor input $V_{IN}$ with the voltage reference $V_{REF1}$. As such, the digital output code for the sensor input $V_{IN}$ depends on the voltage reference $V_{REF1}$. Accordingly, the first voltage reference $V_{REF1}$ has to be precise in order for ADC 12 to output an accurate digital output code for the sensor input $V_{IN}$.

System 10 includes a micro-controller ("controller") 18. As shown in FIG. 1, the output of ADC 12 is connected to controller 18 such that controller 18 receives the digital output code for the sensor input $V_{IN}$ from ADC 12. Controller 18 generally uses the digital output code for the sensor input $V_{IN}$ to control various functions. For instance, in one embodiment, sensor 16 generates a sensor input $V_{IN}$ indicative of a measured physical quantity of a battery of an electric vehicle and controller 18 controls operation of the battery based on the corresponding digital output code for the sensor input $V_{IN}$.

Second voltage reference generator 20 is associated with a switching arrangement 24 having a switch S1. Switch S1 is movable between two switch positions. In the first switch position, switch S1 is connected to a voltage supply $V_{DD}$ thereby providing second voltage reference generator 20 with power for its operation. As a result of being powered by the voltage supply $V_{DD}$, second voltage reference generator 20 is enabled to generate the second voltage reference $V_{REF2}$ and thereby output the second voltage reference $V_{REF2}$ as the calibration voltage $V_{CAL}$. In the second switch position, switch S1 is connected to ground (shown in FIG. 1) thereby not providing second voltage reference generator 20 with power for its operation. Consequently, 0V is outputted from second voltage reference generator 20 effectively as the calibration voltage $V_{CAL}$.

Controller 18 is configured to control operation of switch S1 between the two switch positions. Controller 18 generates a control signal CAL/IN when switch S1 is to be in the first switch position in which switch S1 is connected to the voltage supply $V_{DD}$ thereby enabling second voltage reference generator 20 to generate the second voltage reference $V_{REF2}$ as the calibration voltage $V_{CAL}$. As such, the calibration voltage $V_{CAL}$ is generated using a voltage reference generator with a switchable supply controlled by controller 18. In other words, the calibration voltage $V_{CAL}$ may be switched ON/OFF at any time. Therefore, the input of multiplexor 22 connected to second voltage reference generator 20 may have one of two fixed values: either the second voltage reference $V_{REF2}$ or 0V.

In addition to being provided to switch S1 in order to have switch S1 be in the first position in which second voltage reference generator 20 is switched on to generate the second voltage reference $V_{REF2}$ as the calibration voltage $V_{CAL}$, the control signal CAL/IN is concurrently provided from controller 18 to multiplexor 22 as shown in FIG. 1. The selection operation of multiplexor 22 is analogous to the switching operation of switch S1 in that multiplexor 22 selects the calibration voltage $V_{CAL}$ while receiving the control signal CAL/IN. On the other hand, while the control signal CAL/IN is not provided from controller 18 to switch S1, and thereby is not provided to multiplexor 22, multiplexor 22 selects the sensor input $V_{IN}$.

As such, when second voltage reference generator 20 is controlled per the above-described operation to generate the second voltage reference $V_{REF2}$ as the calibration voltage $V_{CAL}$, multiplexor 22 selects the calibration voltage $V_{CAL}$ instead of the sensor input $V_{IN}$ and provides the calibration voltage $V_{CAL}$ to ADC 12. In this case, in actuality, the second voltage reference $V_{REF2}$ in lieu of the sensor input $V_{IN}$ is provided as the analog input signal to ADC 12. In turn, ADC 12 converts this analog input signal, which during this time is the second voltage reference $V_{REF2}$, into a digital output code using the first reference voltage $V_{REF1}$.

Alternatively, when second voltage reference generator 20 is controlled per the above-described operation to output 0V, multiplexor 22 selects the sensor input $V_{IN}$ instead of the 0V and provides the sensor input $V_{IN}$ to ADC 12. In this case, the sensor input $V_{IN}$ is provided to ADC 12 per conventional ADC operation. In turn, ADC 12 converts the sensor input $V_{IN}$ into a digital output code using the first reference voltage $V_{REF1}$.

In summary, system 10 is configured to provide the sensor input $V_{IN}$ to ADC 12 in a normal operating mode. For example, ADC 12 may convert the sensor input $V_{IN}$ into a digital voltage such that a desired function is performed for the vehicle. ADC 12 may include any number of channels. To test a particular channel of ADC 12 for drift, second voltage reference generator 20 generates the second reference voltage $V_{REF2}$ as the calibration voltage $V_{CAL}$ which is applied to ADC 12 for short periods of time (i.e., when system 10 is placed into a test mode). System 10 may be placed in the test mode throughout its life to test a particular channel in ADC 12 for drift. In the event one or more channels of ADC 12 is detected to be out of range after this calibration voltage $V_{CAL}$ is applied, system 10 may generate a notification signal to indicate to the driver that system 10 may require service (or replacement) due to drift.

To place system 10 in the test mode, controller 18 controls the switch S1 to close (e.g., via control signal CAL/IN) such that the voltage supply $V_{DD}$ provides second voltage reference generator 20 with power for its operation. In turn, second voltage reference generator 20 is enabled to generate the second voltage reference $V_{REF2}$ as the calibration voltage $V_{CAL}$ for provision to multiplexor 22. In the test mode, controller 18 disables the sensor input $V_{IN}$ to multiplexor 22 to prevent the sensor input $V_{IN}$ from being provided to ADC 12 while enabling the input to multiplexor 22 to pass the calibration voltage $V_{CAL}$ (which is the second voltage reference $V_{REF2}$ during the test mode) therefrom and on to ADC 12.

A measurement is performed at the particular channel of ADC 12 to determine if the voltage is within a predetermined range. If the measured voltage is within the range, then controller 18 determines that the particular channel of ADC 12 may not be exhibiting a drift condition. If the measured voltage is out of range, then controller 18 determines that the particular channel of ADC 12 exhibits a drift condition. At this point, the user is notified that system 10 may require service or replacement. By applying the voltage calibration $V_{CAL}$ (i.e., the second voltage reference $V_{REF2}$) for short periods, such a condition may preserve the integrity of second voltage reference generator 20 (or the power supply $V_{DD}$) to ensure that such a component itself does not drift over time. The value of the second voltage reference $V_{REF2}$ may be on the same or different order of the sensor input $V_{IN}$.

Figure 2:
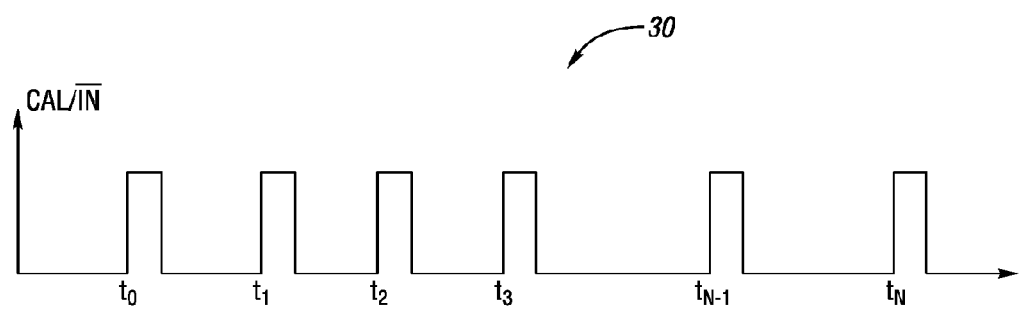
FIG. 2 illustrates a timing diagram indicative of when a second external voltage reference generator of the system shown in FIG. 1 is enabled to generate a second voltage reference in accordance with an embodiment of the present invention.

Referring now to FIG. 2, with continual reference to FIG. 1, a timing diagram 30 indicative of when second voltage reference generator 20 is enabled to generate second voltage reference $V_{REF2}$ as the calibration voltage $V_{CAL}$ in accordance with an embodiment of the present invention is shown. Timing diagram 30 is representative of a test waveform for detecting integrity of ADC 12. Again, second voltage reference generator 20 is enabled to generate second voltage reference $V_{REF2}$ when the control signal CAL/IN is provided from controller 18 to the switch S1 associated with second voltage reference generator 20. Timing diagram 30 illustrates the control signal CAL/IN being provided from controller 18 periodically. As such, second voltage reference $V_{REF2}$ in lieu of the sensor input $V_{IN}$ is provided periodically to ADC 12.

As the second voltage reference $V_{REF2}$ in lieu of the sensor input $V_{IN}$ is provided to ADC 12 only for short periods of time, the variation of second voltage reference $V_{REF2}$ due to aging is minimized. As a result, the relatively higher variation of the first voltage reference $V_{REF1}$ from voltage reference generator 14 can be compensated. Recall that the first voltage reference $V_{REF1}$ from first voltage reference generator 14 is used by ADC 12 in converting an analog input signal such as the sensor input $V_{IN}$ into a digital output code. As such, compensation of variations of the first voltage reference $V_{REF1}$ is desired in order to ensure that the conversion of the sensor input $V_{IN}$ into the digital output code is accurate.

With continual reference to FIG. 2, in order to minimize the number of calibrations, controller 18 tracks the variations of first voltage reference $V_{REF1}$ provided from first voltage reference generator 14 to ADC 12 and provides the second voltage reference $V_{REF2}$ in lieu of the sensor input $V_{IN}$ to ADC 12 at certain times according to the following equations:

$$\Delta t[N]=f(\Delta V[N], \Delta V[N-1], \ldots, \Delta V[1])\ N \geq 1$$

$$\Delta t[N]=t[N]-t[N-1]$$

$$\Delta V[N]=V_{REF\_MEAS}[N]-V_{REF\_MEAS}[N-1]$$

$V_{REF\_MEAS}$ is the digital code output of ADC 12 when the second reference voltage $V_{REF2}$ is provided to ADC 12 in lieu of the sensor input $V_{IN}$. As such, $\Delta V[N]$ is the difference between the digital code outputs of ADC 12 when the second reference voltage $V_{REF2}$ is provided to ADC 12 in lieu of the sensor input $V_{IN}$ during the Nth control signal CAL/IN and the Nth−1 control signal CAL/IN.

In particular, appropriate expressions are:

$$\Delta t[N]=t\text{MIN}+(t\text{MAX}-t\text{MIN})/(1+k^*\Delta V[N])\ N \geq 1$$

or $$\Delta t[N]=t\text{MIN}+(t\text{MAX}-t\text{MIN})^*\exp(-k^*\Delta V[N])\ N \geq 1$$

Controller 18 analyzes the $V_{REF\_MEAS}$ measurements across at least a set of the N samples in order to track for variations in the first voltage reference $V_{REF1}$ over time. Such variations will be discernible upon the $V_{REF\_MEAS}$ measurements varying with one another over time when the second voltage reference $V_{REF2}$ is constant. Conversely, such variations will be discernible upon the $V_{REF\_MEAS}$ measurements not varying with one another over time in accordance with a predetermined variation of the second voltage reference $V_{REF2}$. Upon detecting a variation, controller 18 may compensate for the variation by taking into account an offset voltage for nullifying the variation. Such an offset voltage is taken into account by controller 18 during the operation of ADC 12 in converting the sensor input $V_{IN}$ into a digital output code.

Furthermore, controller 18 can implement a plausibility check or assessment between the first and second voltage references ($V_{REF1}$ and $V_{REF2}$). In particular, if the difference between the $\Delta V[N]$ values does not exceed a specific lower threshold (based on predefined bounds), then the plausibility value of the measurement is not affected. As soon as the measured value exceeds the lower threshold, degradation is started. Upon exceeding the upper threshold, the measure integrity value is maximally degraded, reaching a minimum value. In this case, the measurement is not reliable and an alarm should be activated.

Turning back to FIG. 1, controller 18 is further configured to receive a temperature sensor signal from a temperature sensor 26. Temperature sensor 26 can monitor the temperature of the components of system 10 including one or more of ADC 12, first voltage reference generator 14, and second voltage reference generator 20. Controller 18 may use such temperature signals in order to assist in tracking variations in the first voltage reference $V_{REF1}$ and/or in compensating for such variations.

Figure 3:
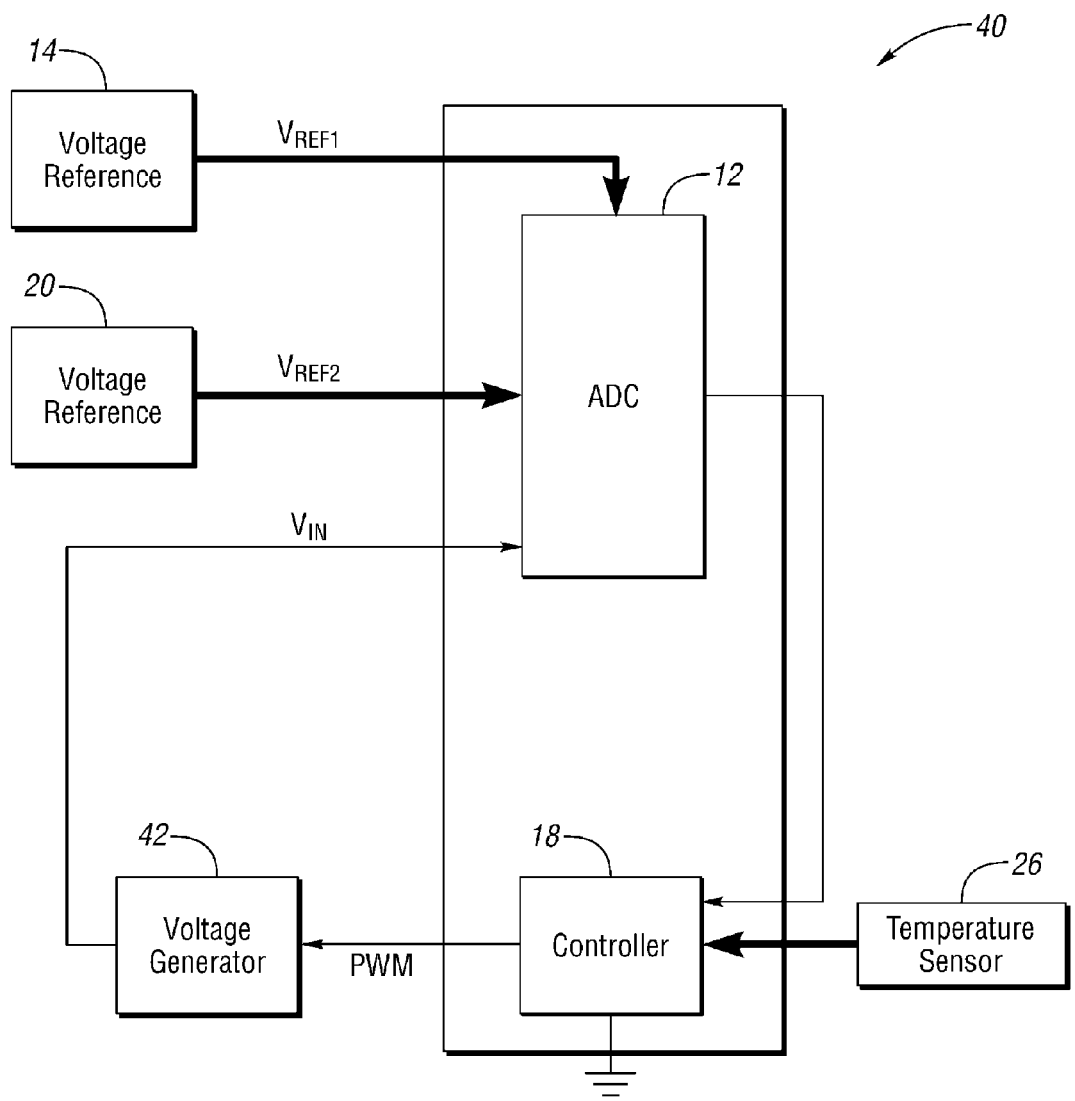
FIG. 3 illustrates a block diagram of a system for monitoring for variation of the voltage reference used by an ADC in converting between analog and digital signals in accordance with another embodiment of the present invention.

Referring now to FIG. 3, with continual reference to FIG. 1, a block diagram of a system 40 for monitoring for variation of the voltage reference of an ADC in accordance with another embodiment of the present invention is shown. In this embodiment, the analog-to-digital converter again is the ADC 12. System 40 includes like components as system 10 and such components are designated with the same reference numerals. In particular, system 40 includes first voltage reference generator 14 for providing the first voltage reference $V_{REF1}$ to ADC 12, second voltage reference generator 20 for providing the second reference voltage $V_{REF2}$ to ADC 12, controller 18 for receiving and processing the digital output code from ADC 12, and temperature sensor 26. System 40 will include other components (such as the sensor 16, the multiplexer 22 or the switching device 24) not shown in the figure.

System 40 further includes a voltage generator 42. Voltage generator 42 is akin to sensor 16 of system 10 shown in FIG. 1 and is configured to provide an analog voltage signal (e.g., sensor input $V_{IN}$) to ADC 12. ADC 12 uses the first voltage reference $V_{REF1}$ in converting the sensor input $V_{IN}$ into a digital output code as explained above.

Controller 18 is configured to provide a pulse-width-modulated ("PWM") signal to voltage generator 42. When PWM signal is high, voltage generator 42 is enabled to provide the sensor input $V_{IN}$ to ADC 12. Conversely, when PWM signal is low, voltage generator 42 is prevented from providing the sensor input $V_{IN}$ to ADC 12.

ADC 12 of system 40 shown in FIG. 3 includes an internal multiplexor (not shown). The internal multiplexor selects between two inputs: the second reference voltage $V_{REF2}$ and the sensor input $V_{IN}$. In particular, the internal multiplexor selects the sensor input $V_{IN}$ instead of the second reference voltage $V_{REF2}$ when voltage generator 42 is enabled. In this case, the sensor input $V_{IN}$ is provided to ADC 12 per conventional ADC operation. On the other hand, the internal multiplexor selects the second reference voltage $V_{REF2}$ instead of the sensor input $V_{IN}$ when the voltage generator 42 is disabled. In this case, in actuality, the second voltage reference $V_{REF2}$ in lieu of the sensor input $V_{IN}$ is provided to ADC 12.

In turn, as described above, ADC 12 generates a digital output code of the selected input using the first reference voltage $V_{REF1}$. Further, controller 18 analyzes over time the digital output codes when the second voltage reference $V_{REF2}$ in lieu of the sensor input $V_{IN}$ is provided to ADC 12. Controller 18 performs this analysis in the manners described above in order to track for variations of the first voltage reference $V_{REF1}$ and/or to compensate for such variations.

With reference to FIGS. 1 and 3, the following method may be employed in system 10 in order to minimize drift in the channels of ADC 12.

1) store data for electronics (as provided by electronics manufacturer) in a table or algorithm inside controller 18;

2) calibrate the channels of ADC 12 when manufacturing the electronic circuit for an initial adjustment, but also to register the differences between the channels;

3) periodically put a channel to ground (via a switching device) to measure the drift at that particular moment; and 4) compensate the channel accordingly and, using previously loaded-data, estimate and compensate for drifts in the other channels.

The above method may also be applied to ADC 12 that is separate from controller 18 (or other suitable device), provided that the proper data is available, or even to some of them if these are close enough to share the same temperature variations. If several ICs with ADC 12 are separate enough from each other to share similar temperature drifts (e.g., due to a heat source in the same circuit), this may be applied if the temperature differences have been identified and tabulated or otherwise stored in advance so that controller 18 is capable of estimating the rest of ADC 12 drifts through the measurement of a single one.

Connection to ground may be used as an external reference because it may be the most stable value in system 10. However, other sources (external to ADC 12 and controller 18) may be used if ground is not available or not convenient (e.g., measurements with positive as reference, noisy ground, etc.).

As described herein, at least some embodiments of the present invention are directed to the concept of introducing a second voltage reference for monitoring variations in the ADC voltage reference. With the additional voltage reference it is possible to generate a voltage with a predetermined variation in order to check whether the measured voltage follows that predetermined variation or not. As operating conditions such as temperature are also monitored this capability is further possible. Such embodiments may provide a kind of voltage reference assessment by double self-checking. In contrast, with only one voltage reference, it is difficult, if not impossible, to know the variation in the voltage reference due to external conditions, aging, etc. As described herein, an intended goal of at least some embodiments of the present invention is that the variation of the voltage reference is minimized in acquisition systems.

As further described herein, some embodiments of the present invention are directed to an in-vehicle sensor system configured to minimize the effect of aging on the ADC circuitry (i.e., in-vehicle sensor system with aging resilience).

Other embodiments of the present invention provide an environment in which the converter is a digital-to-analog converter ("DAC") as opposed to being an ADC. A DAC functions opposite to an ADC in that a DAC converts a digital input signal into an analog output signal. However, a DAC also uses a voltage reference in making this conversion. As such, just as with an ADC, the voltage reference has to be precise in order for the conversion to be accurate.

While exemplary embodiments are described above, it is not intended that these embodiments describe all possible forms of the present invention. Rather, the words used in the specification are words of description rather than limitation, and it is understood that various changes may be made without departing from the spirit and scope of the invention. Additionally, the features of various implementing embodiments may be combined to form further embodiments of the present invention.

What is claimed is:

1. A system comprising:
a converter configured to receive a sensor signal, indicative of a physical measured quantity, and generate an output signal based on the sensor signal and a voltage reference, the converter further configured to at a plurality of different times alternately receive a calibration voltage in lieu of the sensor signal and generate the output signal based on the calibration voltage and the voltage reference; and
a controller configured to compare the output signals at the different times with one another to detect variation of the voltage reference.

2. The system of claim 1 wherein:
the controller is further configured to control when the converter receives the calibration voltage in lieu of the sensor signal.

3. The system of claim 1 wherein:
the controller is further configured to compensate the output signal based on the sensor signal and the voltage reference as a function of the detected variation of the voltage reference.

4. The system of claim 1 further comprising:
a voltage generator configured to generate the voltage reference and provide the voltage reference to the converter.

5. The system of claim 1 further comprising:
a voltage generator configured to generate the calibration voltage for receipt by the converter.

6. The system of claim 1 further comprising:
a sensor configured to generate the sensor signal for receipt by the converter.

7. The system of claim 1 wherein:
the converter is an analog-to-digital converter.

8. A system comprising:
a first voltage generator configured to generate a voltage reference;
a converter configured to generate an output signal based on an input signal and the voltage reference;
a second voltage generator configured to generate a calibration voltage;
a sensor configured to generate a sensor signal indicative of a physical measured quantity; and
a controller configured to control the converter to receive the sensor signal as the input signal such that the converter generates the output signal based on the sensor signal and the voltage reference and to control the converter to alternately receive at a plurality of different times the calibration voltage as the input signal in lieu of the sensor signal such that the converter generates the output signal based on the calibration voltage and the voltage reference, the controller further configured to compare the output signals at the different times with one another to detect variation of the voltage reference.

9. The system of claim 8 wherein:
the controller is further configured to compensate the output signal based on the sensor signal and the voltage reference as a function of the detected variation of the voltage reference.

10. The system of claim 8 wherein:
the converter is an analog-to-digital converter.

11. A method comprising:
receiving, at a converter, a sensor signal indicative of a physical measured quantity and generating, by the converter, an output signal based on the sensor signal and the voltage reference;
periodically alternately receiving, at the converter, a calibration signal in lieu of the sensor signal and generating, by the converter, the output signal based on the calibration voltage and the voltage reference; and
comparing the output signals based on the calibration voltage and the voltage reference with one another to detect variation of the voltage reference.

12. The method of claim 11 further comprising:
compensating the output signal based on the sensor signal and the voltage reference as a function of the detected variation of the voltage reference.

13. The method of claim 11 further comprising:
generating the voltage reference at a voltage generator and providing the voltage reference from the voltage generator to the converter.

14. The method of claim 11 further comprising:
generating the calibration voltage at a voltage generator for receipt by the converter.

15. The method of claim 11 further comprising:
generating the sensor signal at a sensor for receipt by the converter.

16. The method of claim 11 wherein:
the converter is an analog-to-digital converter.

* * * * *